United States Patent
Jung et al.

(10) Patent No.: US 6,896,743 B2
(45) Date of Patent: May 24, 2005

(54) WAFER DRYING METHODS OF MARANGONI TYPE AND APPARATUS SUITABLE THEREFOR

(75) Inventors: Jae-Hyung Jung, Kyunggi-do (KR); Young-Min Kwon, Kyunggi-do (KR); Jong-Jae Lee, Kyunggi-do (KR); Dong-Hoon Jung, Kyunggi-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 402 days.

(21) Appl. No.: 10/041,227

(22) Filed: Jan. 8, 2002

(65) Prior Publication Data

US 2002/0195125 A1 Dec. 26, 2002

(30) Foreign Application Priority Data

Jun. 26, 2001 (KR) ........................................ 2001-36625

(51) Int. Cl.[7] ................................ B08B 3/00; F26B 3/06
(52) U.S. Cl. .............................. 134/26; 134/30; 134/31; 34/404; 34/410
(58) Field of Search ............................ 134/26, 30, 31, 134/37; 34/402, 404, 410

(56) References Cited

U.S. PATENT DOCUMENTS

| | | | | |
|---|---|---|---|---|
| 5,913,981 A | * | 6/1999 | Florez | ............................ 134/3 |
| 6,095,167 A | * | 8/2000 | Florez | ........................ 134/183 |
| 6,588,437 B1 | * | 7/2003 | Higashi | ....................... 134/148 |

* cited by examiner

Primary Examiner—Michael Barr
Assistant Examiner—Saeed Chaudhry
(74) Attorney, Agent, or Firm—Myers Bigel Sibley & Sajovec, P.A.

(57) ABSTRACT

A wafer drying method includes submerging a wafer in a cleaning solution in a dry chamber. An organic liquid vapor from an organic liquid is supplied into the dry chamber at a first volumetric supply rate to form an organic liquid layer on a surface of the cleaning solution, the organic liquid layer having at least a prescribed concentration of the organic liquid. The organic liquid vapor is supplied into the dry chamber at a second volumetric supply rate that is lower than the first volumetric supply rate. During and/or following the supplying of the organic liquid vapor into the dry chamber, at least a portion of the wafer is removed from the cleaning solution through the organic liquid layer.

4 Claims, 6 Drawing Sheets

WAFER DRYING METHODS OF MARANGONI TYPE AND APPARATUS SUITABLE THEREFOR

RELATED APPLICATIONS

This application claims priority from Korean Patent Application No. 2001-36625, filed on Jun. 26, 2001, the disclosure of which is hereby incorporated herein by reference in its entirety.

FIELD OF THE INVENTION

The present invention generally relates to wafer drying methods and apparatus and, more particularly, to a wafer drying methods of Marangoni type and apparatus suitable therefor.

BACKGROUND OF THE INVENTION

In processing a wafer to fabricate a semiconductor device, it is important to prevent particles from contacting the wafer surface. Because even fine particles may greatly affect formation and operation of semiconductor devices, maintaining a clean environment and performing cleaning at each wafer processing step can be very important.

A wafer is typically cleaned by a wet cleaning process using a cleaning solution. Even though the cleaning solution may be varied with process characteristics, pure water (i.e., deionized water) is conventionally used to clean chemical materials or particles from a wafer.

There is a need for drying the cleaned wafer without affecting the surface of the cleaned wafer. If the cleaned wafer is exposed to water for a long time, a substrate surface material of the wafer may be denaturalized. Even weak denaturalization may cause substantial problems for large-scaled semiconductor devices. A spin drying method may be used as a wafer drying method. If the spin drying method is used, liquid is easily removed but particles are likely to reattach to the wafer. Alternatively, the Marangoni wafer drying method may be used. The Marangoni wafer drying method uses the surface tension of a liquid. The Marangoni wafer drying method will be described hereinbelow with reference to FIG. 1 and FIG. 2.

Referring now to FIG. 1, a wafer 60 is submerged in deionized water 40 in a liquid bath 20 in a dry chamber 10. Organic liquid vapor such as isopropyl alcohol (IPA) vapor 70 is provided to and around a surface of the deionized water 40 through a vapor pipe 50. Referring now to FIG. 2, the organic liquid vapor is continuously provided, and the submerged wafer 60 is removed from (i.e., exposed to the exterior of) the deionized water 40 by draining the deionized water 40 through a drain valve 85 of a drain pipe 80. Alternatively, the wafer 60 may be carried through a surface of deionized water.

During the foregoing process, the organic liquid vapor is condensed or dissolved to form a liquid film such as an IPA film 30. A differential between the surface tensions of the IPA film 30 and the deionized water 40 at an interface therebetween serves to prevent particles from reattaching to a surface of the wafer 60 crossing the interface and also serves as a force to remove liquid from the surface of the wafer 60. Diacetone and 1-methoxy-2-propane as well as IPA may be used as the organic liquid.

When the wafer is submerged in the deionized water and the organic liquid vapor is first provided, a vapor supply volume or a vapor supply time must be sufficient to raise the concentration of the organic liquid in the dry chamber 10 to a predetermined level. Preferably, as the wafer is lifted from the deionized water or the surface of the water is lowered to dry the wafer, the volumetric supply rate of the vapor (i.e., the volume of the supplied organic liquid vapor supplied per unit of time (for example, liters per minute)) is reduced to a predetermined level in order to stabilize the organic liquid concentration at the surface of the deionized water as well as the partial pressure of the organic liquid vapor in the dry chamber 10. If the partial pressure of the organic liquid vapor is high as the deionized water is slowly drained, the organic liquid may condense on the wafer surface at locations not submerged in the water. The condensed organic liquid may be removed in a subsequent drying step, which may increase the concentration of particles on the wafer at such locations.

FIG. 3 is a graph illustrating the above-mentioned problems associated with particles, wherein "pre" refers to the number of particles per area on a wafer tested before the wafer is dried, "after" refers to the number of particles measured after the wafer is dried by the conventional Marangoni drying method using IPA vapor, and "diff" refers to a difference in the number of particles measured before and after the wafer is dried.

FIG. 4 illustrates a conventional wafer drying apparatus that supplies organic liquid vapor using a bubbling method. In such a wafer drying apparatus of the Marangoni type, the organic liquid vapor is restrictively supplied by a pressurized bubbling gas source through one bubbling gas supply pipe 120. Therefore, if the bubbling gas source pressure is high so that the volumetric supply rate of the supplied vapor is large, the time required for a first step of drying the wafer may be reduced. However, the concentration of organic liquid on the interface surface of the deionized water may become high as a result of organic liquid vapor supplied in a second step. Thus, particles may increase in number, presenting a high likelihood that particles will reattach to the wafer.

If the bubbling gas pressure is low, the time required to supply sufficient organic liquid vapor to raise the concentration of the organic liquid on the surface of the deionized water to the predetermined level becomes long. This may result in a long process time, as well as erosion and denaturalization of a metal layer or the like formed on a semiconductor substrate.

SUMMARY OF THE INVENTION

In view of the foregoing needs, the present invention provides Marangoni-type wafer drying methods and apparatus suitable therefor.

According to embodiments of the present invention, a wafer drying method includes submerging a wafer in a cleaning solution in a dry chamber. An organic liquid vapor from an organic liquid is supplied into the dry chamber at a first volumetric supply rate to form an organic liquid layer on a surface of the cleaning solution, the organic liquid layer having at least a prescribed concentration of the organic liquid. The organic liquid vapor is supplied into the dry chamber at a second volumetric supply rate that is lower than the first volumetric supply rate. During and/or following the supplying of the organic liquid vapor into the dry chamber, at least a portion of the wafer is removed from the cleaning solution through the organic liquid layer.

According to further embodiments of the present invention, a wafer drying apparatus includes a sealable dry chamber. A wafer liquid bath is disposed in the dry chamber and adapted to contain a cleaning solution. The apparatus includes means for gradually removing at least a portion of a wafer submerged in the cleaning solution through a surface of the cleaning solution. Vapor generating means are provided for generating organic liquid vapor from an organic liquid and controlling a supply of the organic liquid vapor such that the organic liquid vapor can be supplied at at least two volumetric supply rates. An organic liquid vapor supply pipe is provided for supplying the organic liquid vapor generated by the vapor generating means to the dry chamber.

Objects of the present invention will be appreciated by those of ordinary skill in the art from a reading of the figures and the detailed description of the preferred embodiments which follow, such description being merely illustrative of the present invention.

DETAILED DESCRIPTION OF THE PREFERRED EMBODIMENTS

Figure 1:
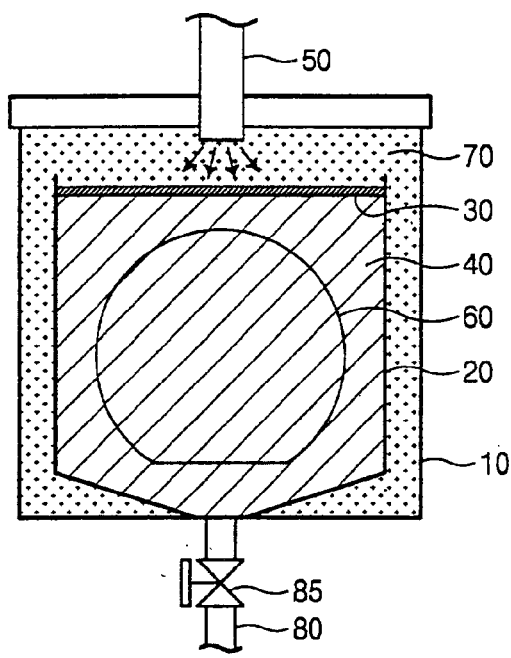
FIG. 1 and FIG. 2 are schematic views showing a conventional wafer drying apparatus of Marangoni type.
Figure 2:
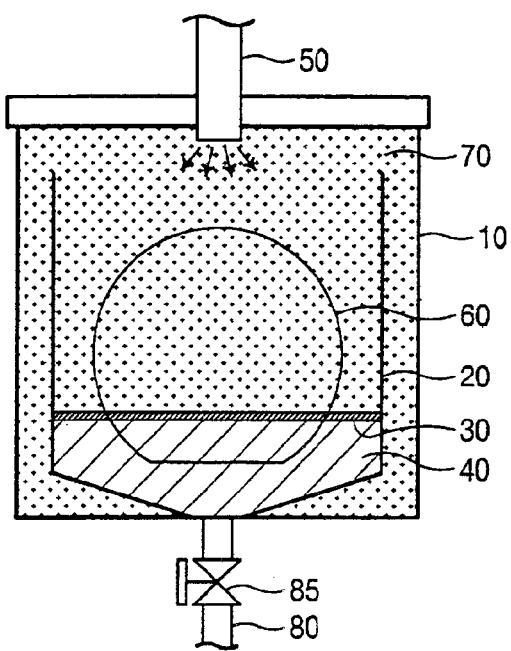
Figure 3:
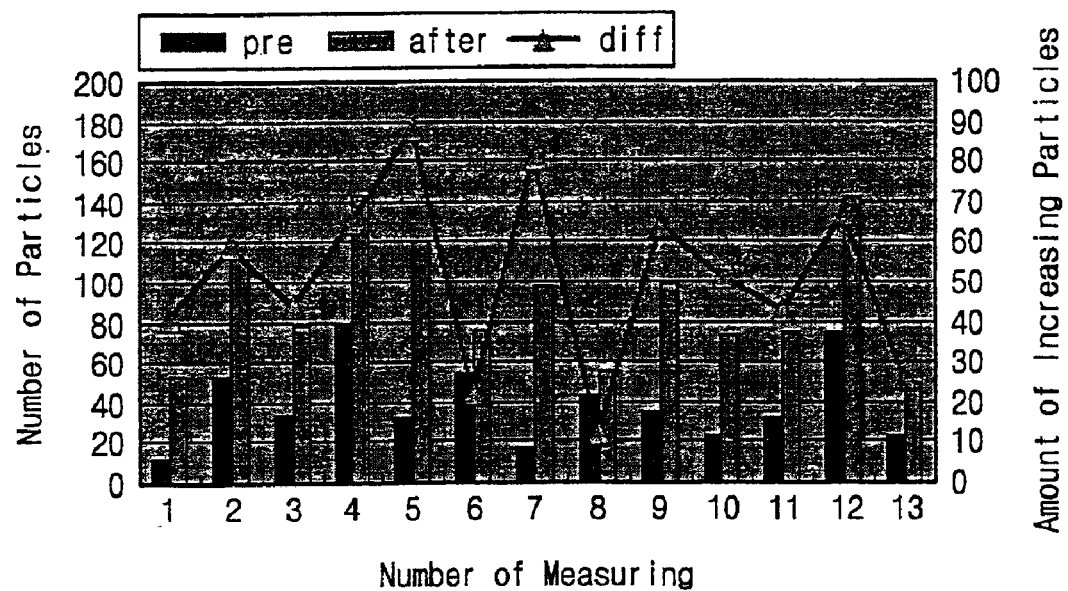
FIG. 3 is a graph illustrating problems associated with particles created by oversupplying IPA vapor during low-speed draining of a cleaning solution.
Figure 4:
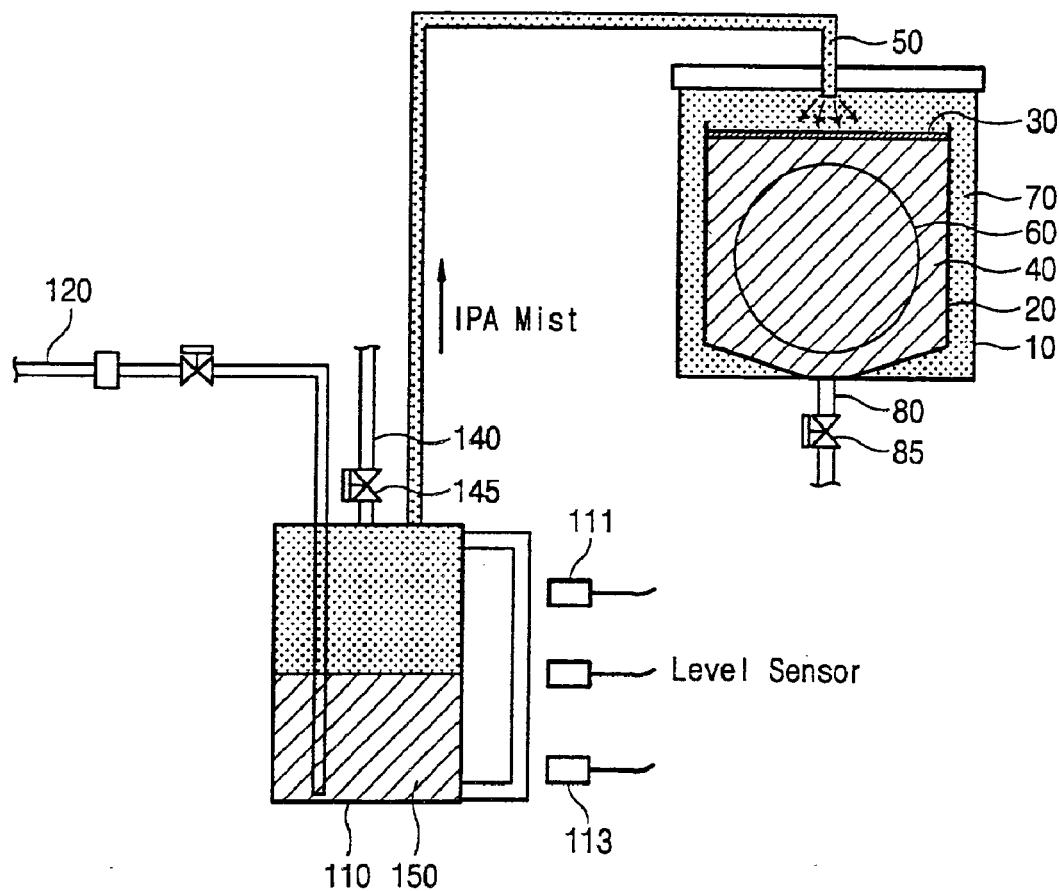
FIG. 4 is a schematic diagram illustrating a conventional wafer drying apparatus supplying IPA vapor using a bubbling method.

The present invention now is described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numerals refer to like elements except as otherwise discussed herein.

Figure 5:
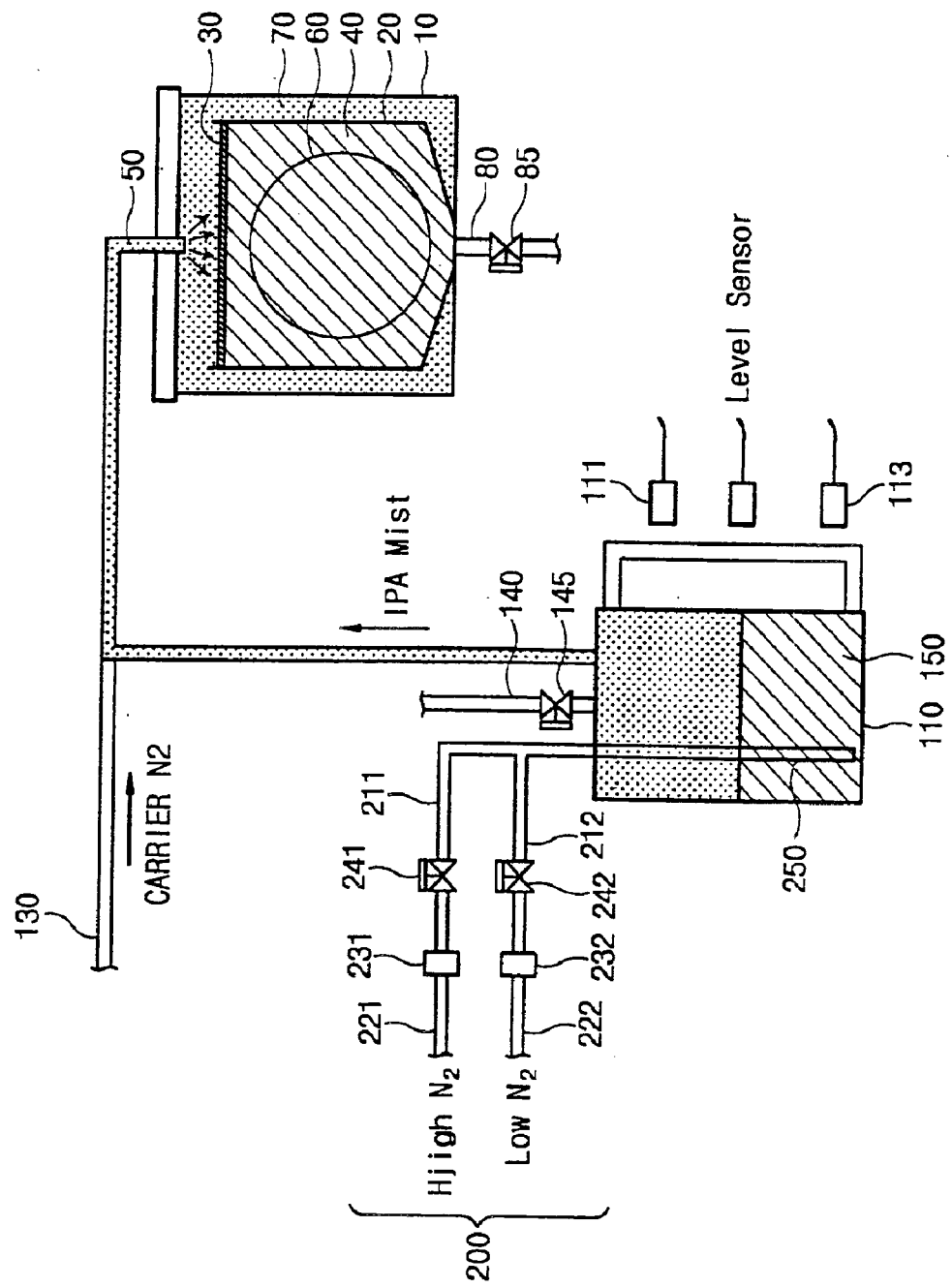
FIG. 5 is a schematic diagram illustrating a wafer drying apparatus according to embodiments of the present invention.

A wafer drying apparatus according to embodiments of the present invention is schematically illustrated in FIG. 5. The wafer drying apparatus of FIG. 5 includes a dry chamber 10, a bubbling chamber 110, an organic liquid vapor pipe 50 for interconnecting the chambers 10 and 110 to each other, and a bubbling gas supply pipe system 200. The bubbling gas supply pipe system 200 includes two branching input ends 212 and 211 that are connected to bubbling gas sources of different pressures. One of the bubbling gas sources, connected to the input end 212, is a nitrogen pipe 222 having a relatively low pressure, preferably of about 2 kg/cm$^2$. The other bubbling gas source, connected to the input end 211, is a nitrogen pipe 221 having a relatively high pressure, preferably of about 6 kg/cm$^2$. Mass flow controllers (MFCs) 231 and 232 and switch valves 241 and 242 are installed at the input ends 211 and 212, respectively. The other end 250 of the bubbling gas supply pipe system 200 is located at a lower part of the bubbling chamber 110.

A pipe 140 for supplying a selected, suitable organic liquid cleaning solution, preferably isopropyl alcohol (IPA) (hereinafter referred to as IPA), is connected to an upper part of the bubbling chamber 110. Liquid IPA 150 is contained in the chamber 110. The lower end 250 is submerged in the liquid IPA 150. Sensors 111 and 113 of a leveling device are positioned at the upper and lower parts of the bubbling chamber 110, respectively. When the upper sensor 111 senses IPA, a valve 145 of the pipe 140 supplying IPA to the bubbling chamber 110 is shut off to stop the supply of the IPA. When the lower sensor 113 senses IPA, the valve 145 is opened to start supplying the IPA.

A liquid bath 20 is provided in the dry chamber 10. A supply of a cleaning solution, preferably deionized water, is contained in the liquid bath 20. The dry chamber 10 is sealable. A wafer 60 to be dried is submerged in the deionized water in the liquid bath 20. A drain pipe 80 and a drain valve 85 pass through a lower edge of the liquid bath 20 and a lower wall body of the dry chamber 10. Furthermore, a device for providing deionized water may be operatively connected with the liquid bath 20.

A pipe 50 is fluidly connected to the dry chamber 10 and passes through a wall of the dry chamber 10 to supply organic liquid vapor into the dry chamber 10. Preferably, the outlet of the pipe 50 is located adjacent a liquid surface of the deionized water 40. A carrier gas pipe 130 is connected to the organic liquid vapor pipe 50. Nitrogen gas is introduced into the organic liquid vapor pipe 50 through the pipe 130 at a predetermined pressure to carry the organic liquid vapor in the pipe 50 to the dry chamber 10.

The wafer drying apparatus as described above may be used in the following manner. The liquid bath 20 in the dry chamber 10 is filled with the deionized water 40. The dry chamber 10 is partially opened to submerge the wafer in the liquid bath 20. The dry chamber 10 is sealed and the valve 241 is opened to generate bubbles and IPA vapor in the liquid IPA 150 contained in the bubbling chamber 110. The IPA vapor is carried to the dry chamber 10 through the organic liquid vapor pipe 50 by a pressure differential. Additional nitrogen gas may be provided from the carrier gas pipe 130 to carry the IPA vapor. The high-pressure nitrogen pipe 221 maintains an amount of the IPA vapor at a relatively high level of pressure. This high pressure level provides the IPA vapor 70 in the dry chamber 10 with a high partial pressure and, in turn, a high level of IPA dissolved on the surface of the deionized water in the liquid bath 20. In this manner in a shorter time than that of conventional methods, an IPA layer 30 having a concentration higher than a prescribed or predetermined concentration may be formed. The step of providing the IPA vapor 70 in the dry chamber 10 with a high partial pressure is referred to as a first step.

After the IPA layer 30 having a concentration higher than the predetermined concentration is formed on the surface of the deionized water 40, the drain valve 85 connected to a lower part of the liquid bath 20 is opened and the surface of the deionized water 40 is drained downwardly. During the draining step, the valve 241 is shut off while the valve 242 is opened. In this manner, the generation of IPA vapor from the bubbling chamber 110 can be reduced. As a result, the partial pressure of the IPA vapor 70 in the dry chamber 10 also decreases. The step of providing a low partial pressure of IPA in the dry chamber 10 is referred to as a second step. As the deionized water 40 is drained, the interface between the deionized water 40 and the IPA layer 30 moves relative to the wafer to brush a surface of the wafer 60. In this manner, liquid on the wafer surface is dried at this interface in accordance with the Marangoni drying method.

In the method embodiments just described, the wafer 60 is removed from the cleaning solution 40 by draining the cleaning solution 40 from the liquid bath 20. In alternative method embodiments, the wafer 60 may be removed from the cleaning solution by lifting the wafer 60 from the cleaning solution to over the surface of the cleaning solution using a lifting device. Accordingly, as used herein, "removed" or "removing" means relatively displacing the wafer and the cleaning solution (e.g., deionized water) such that the wafer is exposed to the atmosphere external to the cleaning solution.

Because the IPA concentration of the IPA layer 30 and the partial pressure of the IPA vapor 70 in the dry chamber 10 are constantly maintained, the IPA vapor 70 does not condense on the surface of the wafer 60 even on the portions of the wafer 60 exposed over the deionized water 40. This can provide a reduction in the amount of particles on the wafer upon drying the IPA. When the wafer 60 is completely exposed over the deionized water 40, an inert gas (e.g., nitrogen) may be blown onto the wafer 40 at the same location or at another location to dry the IPA completely.

Figure 6:
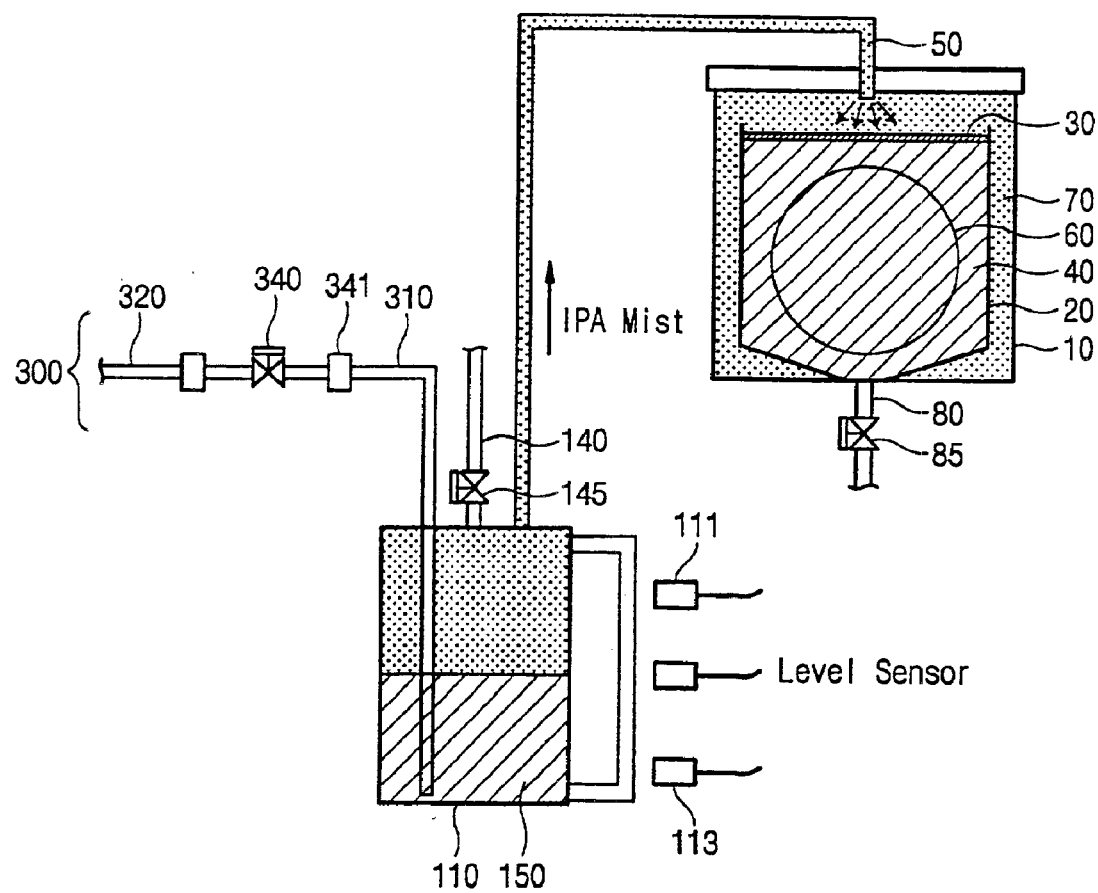
FIG. 6 is a schematic diagram illustrating a wafer drying apparatus according to further embodiments of the present invention.

With reference to FIG. 6, a wafer drying apparatus according to further embodiments of the present invention is shown therein. The apparatus of FIG. 6 corresponds to the apparatus of FIG. 5 except as illustrated in the drawings and described below.

In place of the bubbling gas supply pipe system 200, the apparatus of FIG. 6 includes a bubbling gas supply pipe system 300 having a single, high pressure nitrogen pipe 320. The bubbling gas supply pipe system 300 includes a single input end 310. The high-pressure nitrogen pipe 320 is connected to the single input end 310. A switch valve 340 is mounted at a connection part of the bubbling gas supply pipe system 300. A pressure control valve 341 is mounted downstream of the switch valve 340 and is operable to selectively control the pressure of the bubbling gas introduced through the input end 310 to the bubbling chamber 110. In this manner, the pressure control valve 341 may be used in accordance with the present invention to provide the IPA vapor in the dry chamber 10 with a high partial pressure and, alternatively, a low partial pressure, rather than switching between high and low pressure bubbling gas sources as in the apparatus of FIG. 5. The apparatus of FIG. 6 may otherwise be used in the same manner as the apparatus of FIG. 5 to dry a wafer.

In further alternative embodiments according to the present invention, the IPA vapor supply systems described above (e.g., utilizing high and low bubbling gas sources 221, 222 or a bubbling gas source 320) may be replaced with an IPA vapor generator system that uses heat or supersonic waves to generate vapor for controlling the partial pressure of the IPA vapor in the dry chamber 10. The vapor generator system may include a supersonic wave vapor generator or a heater. The power or heat may be selectively controlled to vary the pressure of the IPA vapor supplied to the dry chamber to thereby implement the foregoing methods of drying a wafer.

Figure 7:
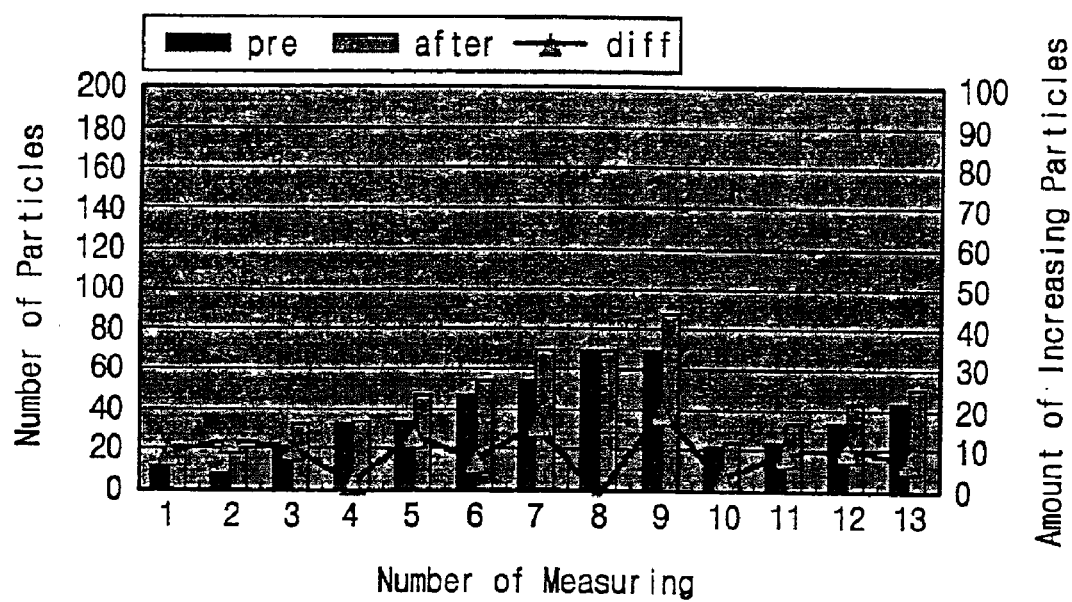
FIG. 7 is a graph illustrating reduction of the increase in particles when an amount of IPA vapor is reduced during low-speed draining of a cleaning solution using a method of the present invention.

FIG. 7 is a graph showing the number and amount of increasing particles measured before/after drying a wafer using method embodiments according to the present invention. As shown in the graph of FIG. 7, the method according to the present invention can provide an outstanding decrease in particles even while a cleaning solution is drained from a conventional liquid bath, compared with a method of supplying IPA vapor of a high pressure to a dry chamber.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A wafer drying method, comprising:

a) submerging a wafer in a cleaning solution in a dry chamber;

b) supplying organic liquid vapor from an organic liquid into the dry chamber at a first volumetric supply rate to form an organic liquid layer on a surface of the cleaning solution, the organic liquid layer having at least a prescribed concentration of the organic liquid; thereafter c) supplying the organic liquid vapor into the dry chamber at a second volumetric supply rate that is lower than the first volumetric supply rate; and d) during and/or following the step c), removing at least a portion of the wafer from the cleaning solution through the organic liquid layer.

2. The wafer drying method of claim 1, wherein the organic liquid is isopropyl alcohol (IPA) and the cleaning solution is deionized water.

3. The wafer drying method of claim 1, further including blowing an inert gas onto the wafer to dry the wafer after the step d).

4. The wafer drying method of claim 1, wherein the first and second volumetric supply rates are controlled by controlling a partial pressure of supplied organic liquid vapor in the dry chamber.

* * * * *